(12) United States Patent
Lo

(10) Patent No.: US 9,511,891 B2
(45) Date of Patent: Dec. 6, 2016

(54) ELASTIC POSITIONING STRUCTURE FOR A SEMICONDUCTOR CARRIER

(71) Applicant: Yu-Nan Lo, Taichung (TW)

(72) Inventor: Yu-Nan Lo, Taichung (TW)

( * ) Notice: Subject to any disclaimer, the term of this patent is extended or adjusted under 35 U.S.C. 154(b) by 0 days.

(21) Appl. No.: 14/729,053

(22) Filed: Jun. 3, 2015

(65) Prior Publication Data

US 2015/0266607 A1    Sep. 24, 2015

Related U.S. Application Data

(63) Continuation-in-part of application No. 14/068,157, filed on Oct. 31, 2013, now abandoned.

(51) Int. Cl.
| | | |
|---|---|---|
| B65D 1/36 | (2006.01) | |
| B65D 73/02 | (2006.01) | |
| H05K 13/00 | (2006.01) | |

(52) U.S. Cl.
CPC ................ B65D 1/36 (2013.01); B65D 73/02 (2013.01); H05K 13/0084 (2013.01)

(58) Field of Classification Search
CPC ...... B65D 1/36; B65D 5/5011; B65D 73/02; H05K 7/1084; H05K 13/0084; H01L 21/67333; H01L 2221/68313
USPC ....... 206/488, 560, 565, 722, 724, 726, 728, 206/719, 725; 29/762; 439/331
See application file for complete search history.

(56) References Cited

U.S. PATENT DOCUMENTS

| | | | | |
|---|---|---|---|---|
| 4,549,651 A | * | 10/1985 | Alemanni | H05K 7/1084 206/560 |
| 4,620,632 A | * | 11/1986 | Alemanni | H05K 7/1084 206/560 |
| 5,000,697 A | * | 3/1991 | Murphy | H05K 7/1084 206/728 |
| 5,012,924 A | * | 5/1991 | Murphy | H05K 13/021 206/719 |
| 5,080,228 A | * | 1/1992 | Maston, III | H05K 7/1084 206/719 |
| 5,131,535 A | * | 7/1992 | O'Connor | H05K 13/0084 206/560 |
| 5,526,936 A | * | 6/1996 | Matsuzoe | H01L 21/67333 206/560 |
| 5,758,776 A | * | 6/1998 | Slocum | H05K 13/0084 206/714 |
| 5,957,293 A | * | 9/1999 | Pakeriasamy | H01L 21/67333 206/565 |
| 5,971,156 A | * | 10/1999 | Slocum | H01L 21/67333 206/560 |
| 6,082,547 A | * | 7/2000 | Nentl | H01L 21/67333 206/560 |
| 6,474,477 B1 | * | 11/2002 | Chang | H01L 21/67333 206/725 |
| 6,612,442 B2 | * | 9/2003 | Soh | H01L 21/67333 206/725 |
| 8,964,404 B2 | * | 2/2015 | Poetzinger | G01R 1/0425 206/714 |

* cited by examiner

Primary Examiner — Bryon Gehman
(74) Attorney, Agent, or Firm — Bruce Stone LLP; Jospeh A. Bruce

(57) ABSTRACT

An elastic positioning structure for a semiconductor carrier is provided with a plurality of stop blocks formed on and extending along the walls of the semiconductor carrier, the fixed end and the elastic free end of the respective stop blocks are located at the same level, so that the fixed end can still serve as a restricting structure to restrict the semiconductor, even when the free end of the stop blocks lose elasticity. The positioning structure has a narrow top and wide bottom, and the recess of the semiconductor carrier is narrow at the top and wide at the bottom, so that the semiconductor can be easily taken out and put into the recess, and can be well restricted in recess without disengaging therefrom.

6 Claims, 6 Drawing Sheets

ELASTIC POSITIONING STRUCTURE FOR A SEMICONDUCTOR CARRIER

This application is a continuation in part of U.S. patent application Ser. No. 14/068,157, which claims the benefit of the earlier filing date of Oct. 31, 2013. Claims 1, 2 and 6 of this application are revised from claims 1, 2 and 6 of the U.S. patent application Ser. No. 14/068,157, claim 3 of this application is the same as claim 4 of the U.S. patent application Ser. No. 14/068,157, and claims 4 and 5 of this application are new.

BACKGROUND OF THE INVENTION

Field of the Invention

The present invention relates to a semiconductor carrier, and more particularly to an elastic positioning structure for a semiconductor carrier.

Description of the Prior Art

FIG. 1 shows a conventional semiconductor carrier structure 10 includes a plurality of walls 11 arranged in a matrix manner to define a plurality of recesses 12 for holding and protecting semiconductors. For better positioning of micro semiconductor and preventing the semiconductor from disengaging from the recess, the semiconductor carrier structure 10 is made of elastic material and integrally formed with an elastic positioning structure which is located on the walls 11 which are L-shaped in cross section. The elastic positioning structure includes an opening 13 partially formed in the transverse portion 112, the longitudinal portion 111 of the walls 11 and partially in the bottom of the recess 12. In the opening 13 is formed a stop block 14 which is L-shaped in cross section and extends from the transverse portion 112 toward the recess 12. The stop block 14 includes a transverse deformation portion 141 connected to the transverse portion 112 of the walls 11 and a longitudinal abutting portion 142 with an end located toward the bottom of the recess 12. When the semiconductor is received in the recess 12, the peripheral side of the semiconductor will be restricted by the longitudinal abutting portion 142 of the stop block 14, so as to prevent the semiconductor from disengaging from the recess 12. Pressing the stop block 14 make the deformation portion 141 deform, the abutting portion 142 will retreat into the opening 13 for facilitating putting semiconductor into and taking it out of the recess 12.

It is to be noted that the upper end of the elastic stop block 14 of the conventional semiconductor carrier structure 10 is fixed to the wall 11 via the deformation portion 141, and the lower end of the elastic stop block 14 retreats back into the opening 13 through deformation. The upper width W1 of the elastic stop block 14 is bigger than the lower width W2 of the elastic stop block 14. The deformation portion 141 itself is elastically deformable, and it is also formed with an aperture 143 to improve elasticity. However, the deformation portion 141 still has to provide a push force for the abutting portion 142 to fix the semiconductor, plus the upper width W 1 of the elastic stop block 14 being bigger than the lower width W2 of the elastic stop block 14, as a result, the deformability of the deformation portion 141 is limited, which makes it not easy to put in or take out the semiconductor. Furthermore, the deformation portion 141 and the abutting portion 142 of the stop block 14 are not located at the same level, when the stop block 14 loses elasticity after long period of use, clearance will appear between the semiconductor and the stop block 14, and the semiconductor will get loose and cannot be fixed anymore.

The present invention has arisen to mitigate and/or obviate the afore-described disadvantages.

SUMMARY OF THE INVENTION

The primary objective of the present invention is to provide an elastic positioning structure for a semiconductor carrier, wherein a plurality of stop blocks is formed on and extends along the walls of the semiconductor carrier, so as to maintain the elastic deformability and recoverability of the abutting section of the stop blocks, and as a result, the semiconductor can be firmly positioned.

Another objective of the present invention is to provide an elastic positioning structure for a semiconductor carrier, wherein the positioning structure has a narrow top and wide bottom, and the recess of the semiconductor carrier is narrow at the top and wide at the bottom, so that the semiconductor can be easily taken out and put into the recess, and can be well restricted in recess without disengaging therefrom.

To achieve the above objectives, an elastic positioning structure for a semiconductor carrier in accordance with present invention is provided, wherein the semiconductor carrier comprises a plurality of transversely and longitudinally arranged walls, each of the recesses including an opening and a bottom opposite to the opening, a direction in which the first walls extend being defined as a direction X, a direction in which the second walls extend being defined as a direction Y, a depth direction of the recesses being defined as a direction Z, each of the first and second walls including an inner surface located within the recesses and an outer surface outside the recesses, the elastic positioning structure being formed on the inner surfaces of the first and second walls and located within the recesses; the elastic positioning structure in the respective recesses comprising:

at least two stop blocks which are arranged in pairs on the inner surface of one of the walls to divide the inner surface into three sections, each of the stop blocks including a connecting section which is connected to the walls, and an abutting section which is connected to the connecting section by a bent section and extends along the direction X or Y, a first angle θ1 (30°≤θ1≤90°) being defined between the connecting section of each of the stop blocks and the walls, a second angle θ2 (90°≤θ2≤160°) being defined between the connecting section and the abutting section, between the connecting sections of the two stop blocks being defined a space, each of the stop blocks including a top surface located corresponding to the opening of the recesses, and a bottom surface located corresponding to the bottom of the recesses, between the top and bottom surfaces, being formed a rear surface located towards the walls, and an oblique surface opposite to the rear surface, the oblique surface enabling each of the stop blocks to become a tapered structure tapering from the bottom surface to the top surface, and the bottom surface has a width bigger than a width of the top surface, a deviation of the inner space of the respective recesses in the direction Z is such that a cross section area of the respective recesses gradually reduces from the opening to the bottom;

each of the recesses being provided on two opposite said walls with two gaps.

Preferably, on one of the first walls are provided two stop blocks, on one of the second walls are provided two stop blocks, the abutting sections of the two stop blocks which are arranged in pairs on the inner surface of one of the walls extend in opposite directions. The protrusion is used to elastically restrict the semiconductor, and the inclined guide surface facilitates insertion of the semiconductor into the recess. More preferably, each of the stop blocks is further provided with an inclined connecting surface which is formed between the inclined guide surface of the protrusion and the bottom surface of the stop blocks.

Preferably, the first angle is 45 degrees, and the second angle is 135 degrees.

DETAILED DESCRIPTION OF THE PREFERRED EMBODIMENTS

Figure 1:
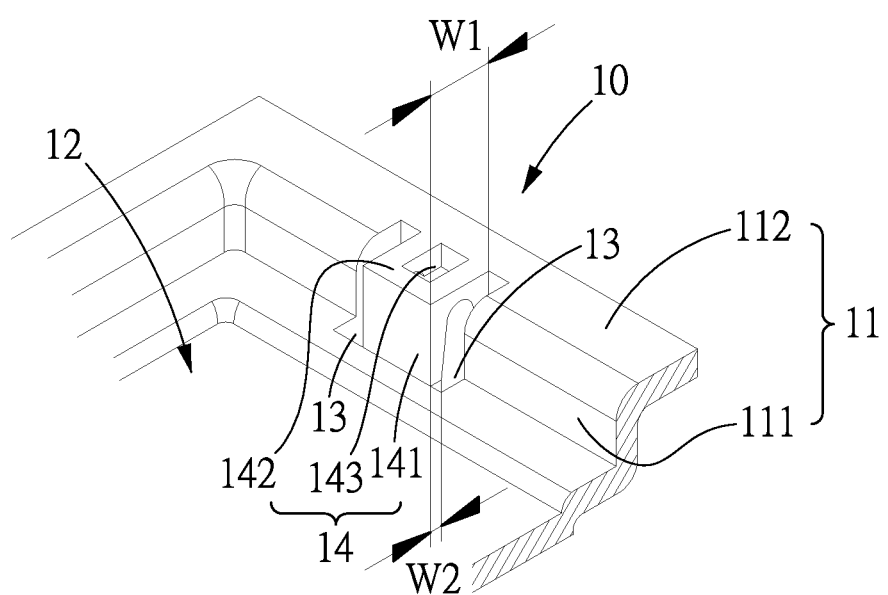
FIG. 1 is a perspective view of a conventional elastic positioning structure for a semiconductor carrier.

The present invention will be clearer from the following description when viewed together with the accompanying drawings, which show, for purpose of illustrations only, the preferred embodiment in accordance with the present invention.

Referring to FIGS. 2-5, an elastic positioning structure for a semiconductor carrier 20 in accordance with the present invention is shown, wherein the semiconductor carrier 20 comprises a plurality of transversely and longitudinally arranged walls 21, 22, wherein the walls 21 are defined as first walls 21 and the walls 22 are defined as second walls 22 which are perpendicular to the first walls 21. The first walls 21 cooperate with the second walls 22 to define a plurality of recesses 30. Each of the recesses 30 includes an opening 31 and a bottom 32 opposite to the opening 31. A direction in which the first walls 21 extend is defined as a direction X, a direction in which the second walls 22 extend is defined as a direction Y, a depth direction of the recesses 30 is defined as a direction Z, and the directions X, Y and Z are perpendicular to one another. Each of the first and second walls 21, 22 includes an inner surface 211, 221 located within the recesses 30 and an outer surface 212, 222 outside the recesses 30. The elastic positioning structure is formed on the inner surfaces 211, 221 of the first and second walls 21, 22 and located within the recesses 30. The elastic positioning structure in the respective recesses 30 includes at least an even number of stop blocks 40 which are arranged in pairs on the inner surface 211, 221 of one and the same first or second wall 21, 22.

Figure 2:
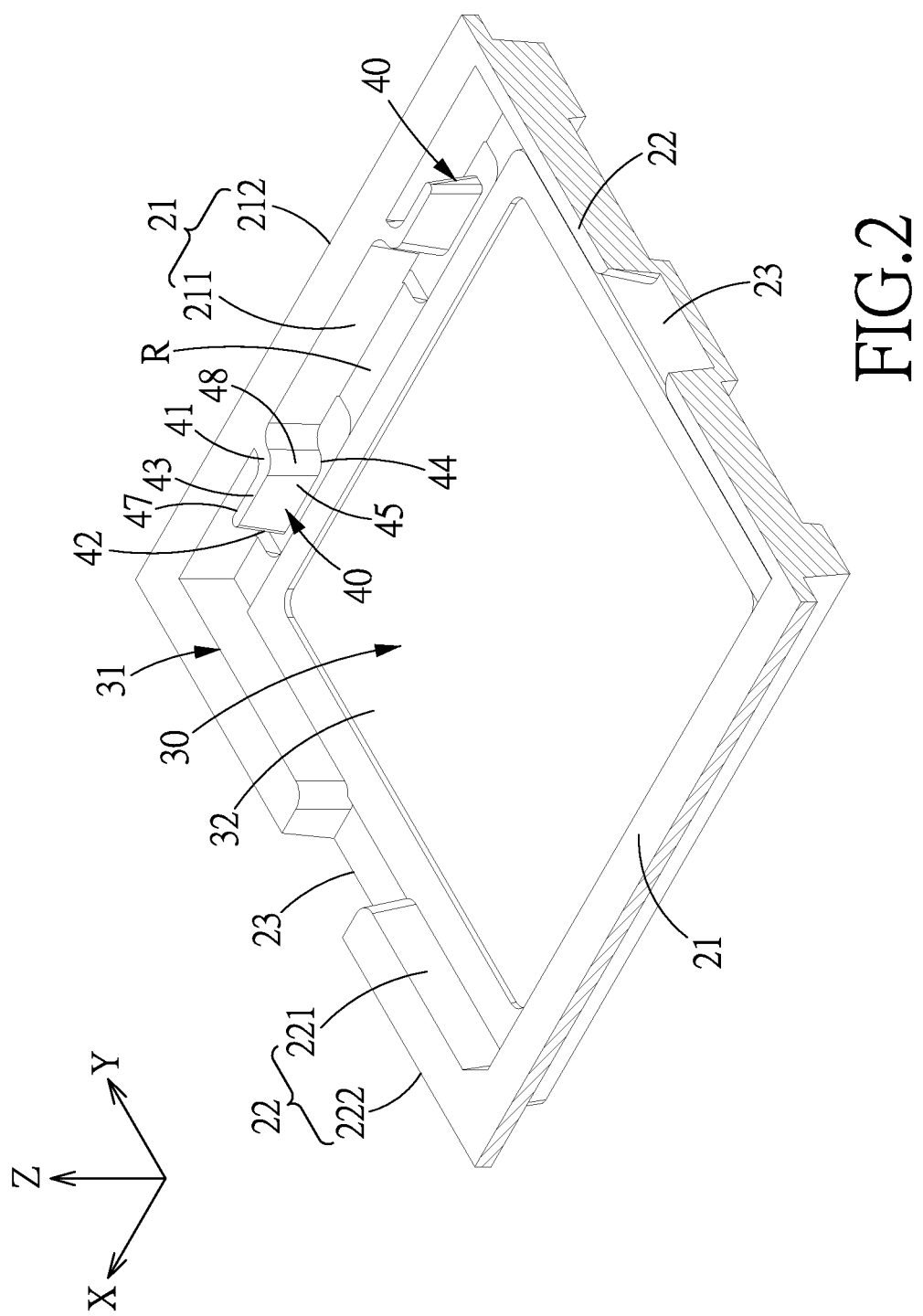
FIG. 2 is a perspective view of an elastic positioning structure for a semiconductor carrier in accordance with the present invention.
Figure 3:
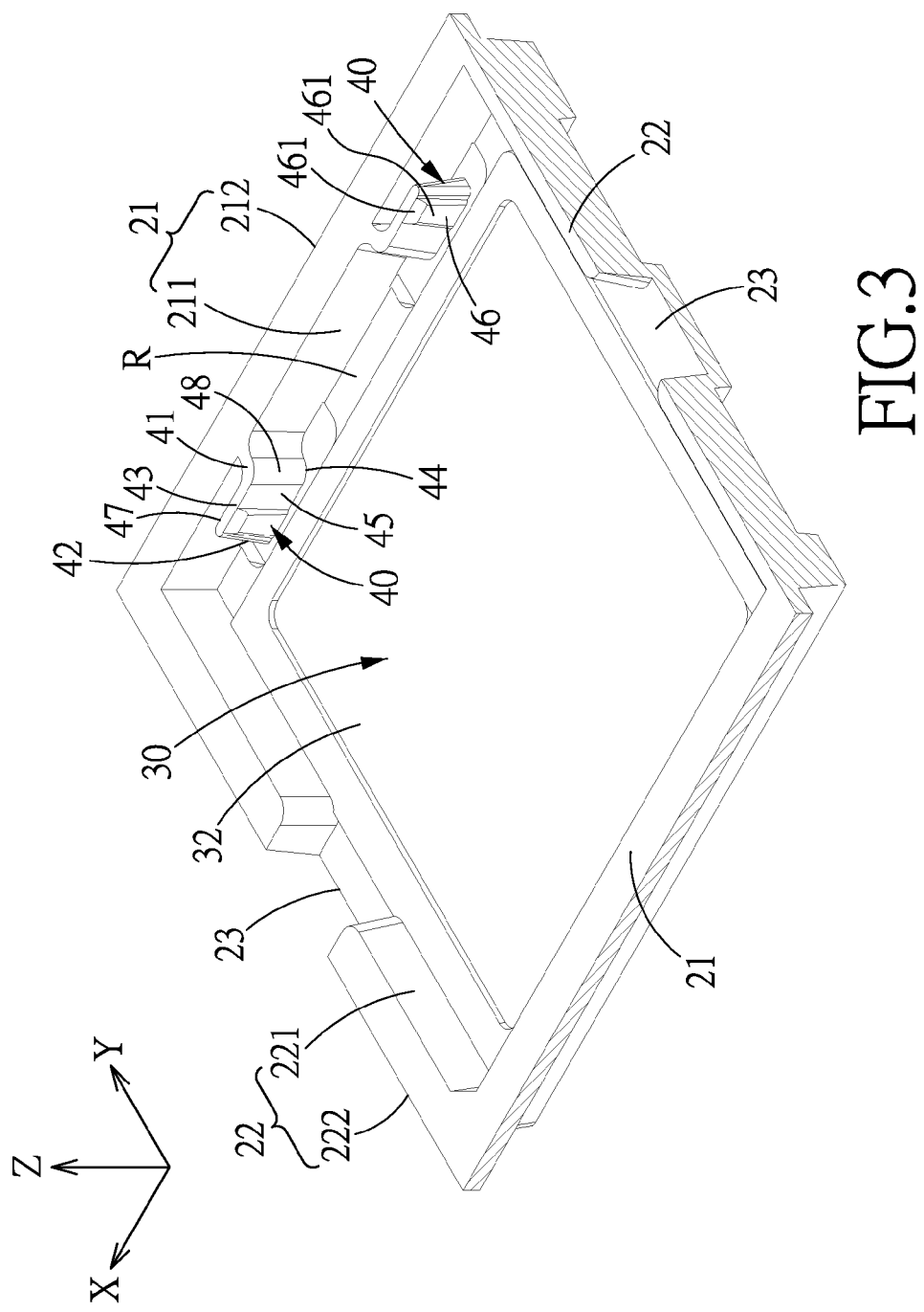
FIG. 3 is a perspective view of an elastic positioning structure for a semiconductor carrier in accordance with a preferred embodiment of the present invention.

In this embodiment, the semiconductor carrier 20 is made of elastic material, and the elastic positioning structure is integrally formed on the inner surface 211, 221 of one and the same first or second wall 21, 22. As shown in FIGS. 2 and 3, forming the stop blocks 40 on the first or second wall 21, 22 can divide the inner surface 211, 221 into three sections. Each of the recesses 30 is provided on two opposite walls 21, 22 with two gaps 23 for enabling the user to grip the edge of the semiconductor A and put it into or take it out of the recess 30. As shown in FIGS. 2-6, each of the gaps 23 are disposed on the second walls 22, but can also be formed on the first walls 21, and preferably in the middle of the first or second walls 21, 22.

Figure 4:
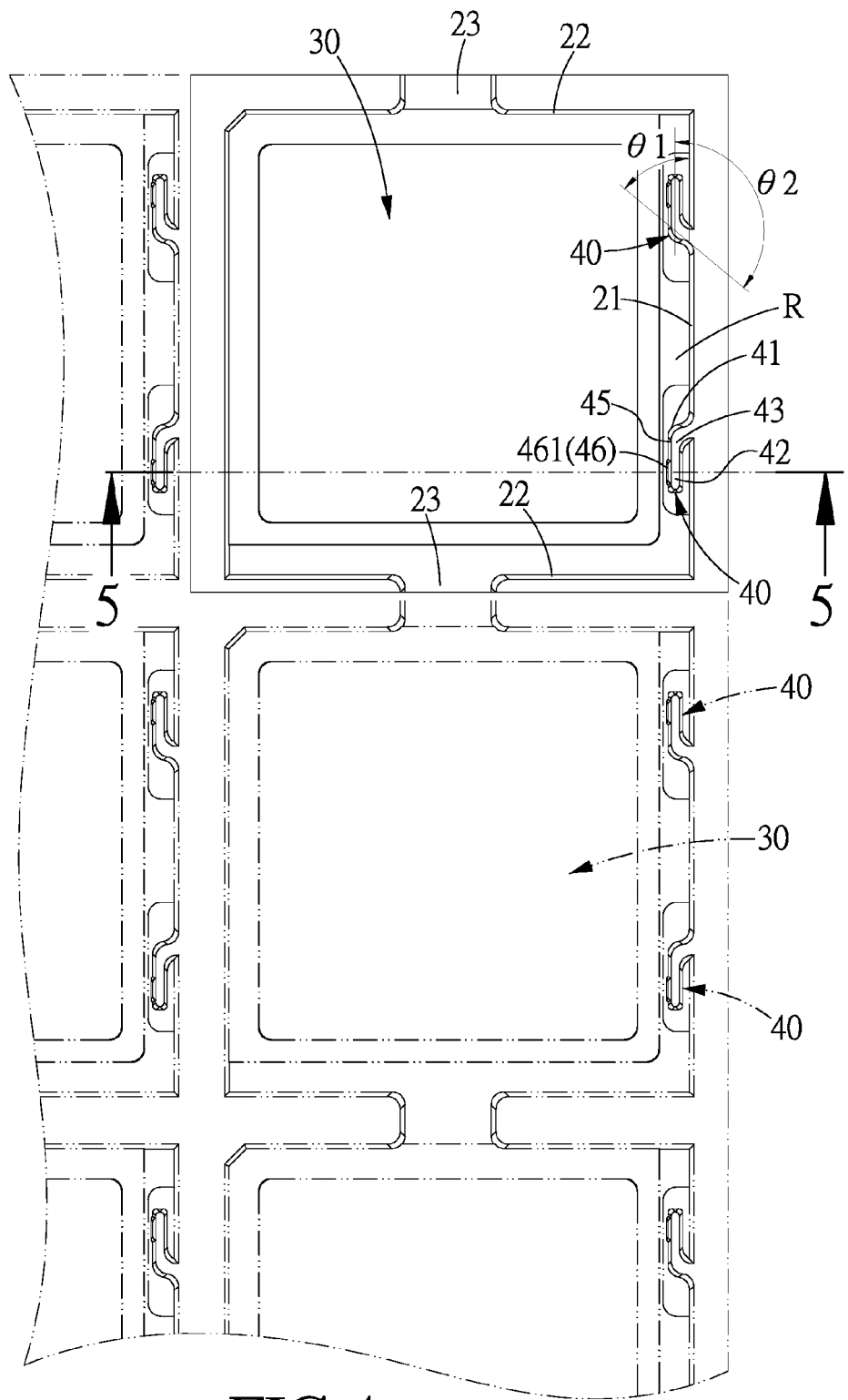
FIG. 4 is a top view of the elastic positioning structure for a semiconductor carrier in accordance with the present invention.
Figure 5:
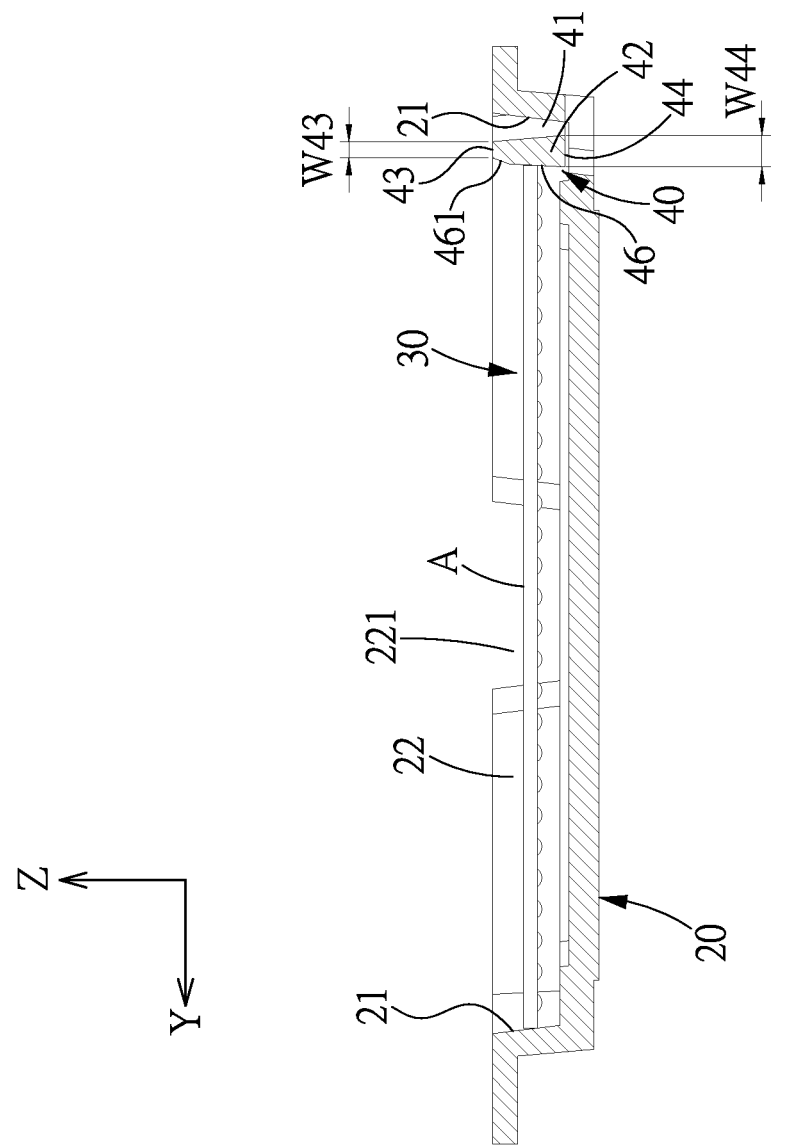
FIG. 5 is a cross sectional view of FIG. 4.
Figure 6:
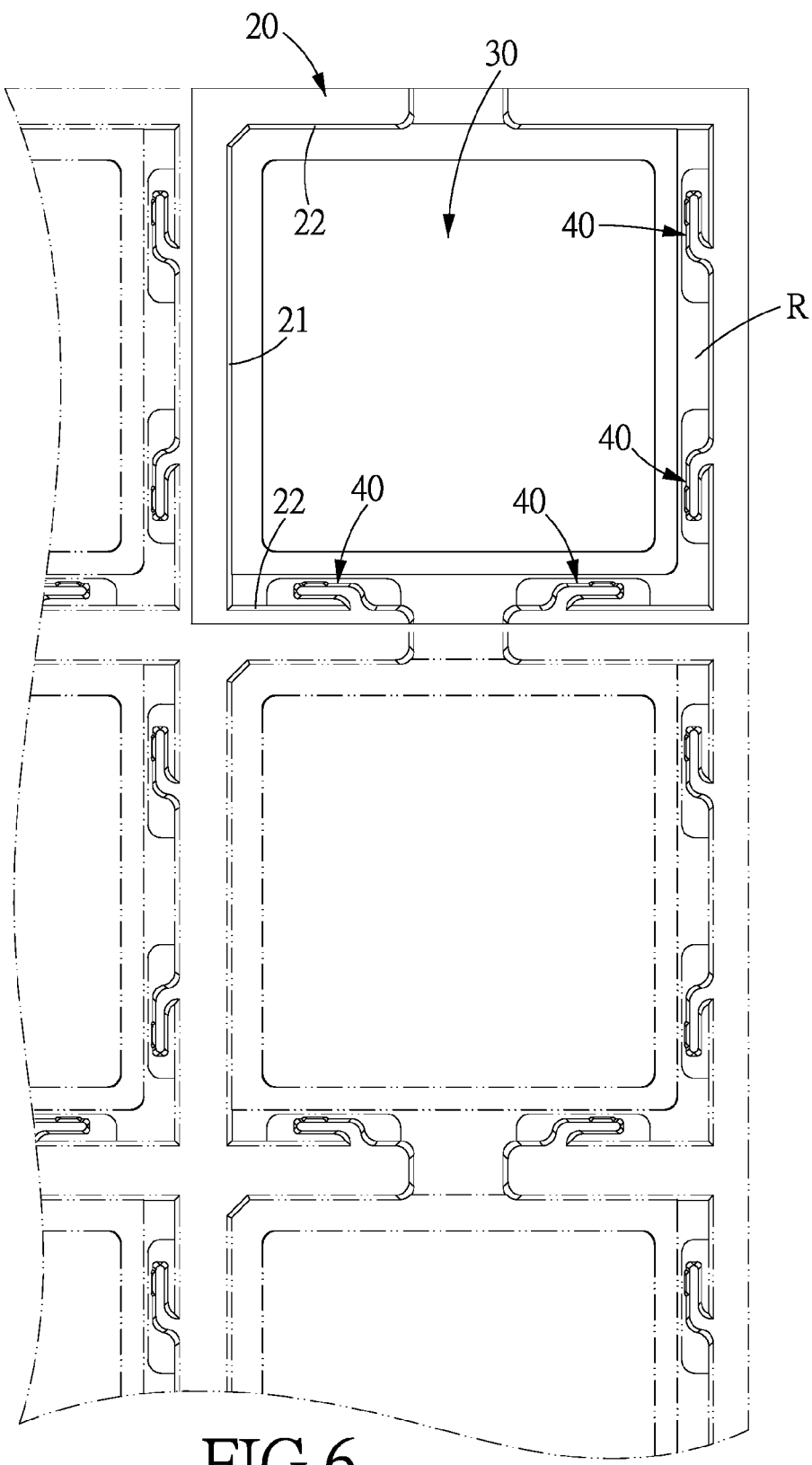
FIG. 6 is another top view of the elastic positioning structure for a semiconductor carrier in accordance with the present invention.

As shown in FIGS. 4 and 6, each of the stop blocks 40 includes a connecting section 41 which is connected to the first or second walls 21, 22, and an abutting section 42 which is connected to the connecting section 41 by a bent section 48 and extends along the direction X or Y and is in parallel with the first or second walls 21, 22. A first angle θ1 (30°≤θ01≤90°) is defined between the connecting section 41 of the stop block 40 and the walls 21, 22, a second angle θ2 (90°≤θ2≤160°) is defined between the connecting section 41 and the abutting section 42, between the connecting sections 41 of the two stop blocks 40 which are located on one and the same first or second wall 21, 22 is defined a space R which functions similarly to the gaps 23 for enabling the user to grip the edge of the semiconductor A and put it into or take it out of the recess 30. The first and second angles θ1, θ2 provide the connecting section 41 and the bent section 48 a better deformability. In FIG. 3, the first angle θ1 is 45 degrees, and the second angle θ2 is 135 degrees.

As shown in FIG. 2, each of the stop blocks 40 includes a top surface 43 located corresponding to the opening 31 of the recesses 30, and a bottom surface 44 located corresponding to the bottom 32 of the recesses 30. Between the top and bottom surfaces 43, 44 are formed a rear surface 47 located towards the walls 21, 22, and an oblique surface 45 opposite to the rear surface 47. With the oblique surface 45, each of the stop blocks 40 becomes a tapered structure tapering from the bottom surface 44 to the top surface 43, and the bottom surface 44 has a width W44 bigger than a width W43 of the top surface 43. With the design of the oblique surface 45, the deviation in Z-direction of the inner space of the respective recesses 30 is such that the cross section area of the respective recesses 30 in the X-Y direction gradually reduces from the opening 31 to the bottom 32. The deviation of the inner space of the respective recesses 30 in Z-direction allows the semiconductor A to be taken out or put into the recesses 30 more easily. If the size of the semiconductor A is equal to or bigger than the X-Y cross section of the recesses 30, the bent section 48 will be pressed and elastically deformed to make the abutting section 42 push against the semiconductor A, so as to provide better elastic positioning of the semiconductor A.

To further improve the capability of the stop block 40 in positioning and restricting the semiconductor A, as shown in FIG. 3 which shows an improvement made based on FIG. 2, the oblique surface 45 of the stop block 40 is provided at the abutting section 42 with a protrusion 46 protruding toward the recess 30. The protrusion 46 has an inclined guide surface 461 which is connected to the top surface 43 of the stop block 40 and inclined toward the recess 30. The inclined guide surface 461 facilitates insertion of the semiconductor A into the recess 30. Besides, the protrusion 46 reduces the X-Y cross section area of the recess 30, when the semiconductor A is inserted into the recess 30, the bent section 48 will be deformed more strongly to increase the pressing force between the abutting section 42 of the stop block 40 and the semiconductor A, thus enhancing he semiconductor positioning function of the semiconductor carrier 20, while ensuring that the semiconductor A can be easily put in or taken out of the recess 30. Preferably, between the inclined guide surface 461 of the protrusion 46 and the bottom surface 44 of the stop blocks 40 is formed an inclined connecting surface 462 which functions similarly to the oblique surface 45, and the inclination of the inclined connecting surface 462 with respect to the direction Z is smaller than that of the oblique surface 45.

There can be two stop blocks 40 on a same first wall 21 of each of the recesses 30, as shown in FIG. 4. Or, two stop blocks 40 on one and the same first wall 21, and another two stop blocks 40 on a same second wall 22, as shown in FIG. 6, and the abutting sections 42 of two neighboring stop blocks 40 on one and the same wall 21, 22 extend in opposite directions, so as to provide better elastic positioning of the semiconductor A.

While we have shown and described various embodiments in accordance with the present invention, it is clear to those skilled in the art that further embodiments may be made without departing from the scope of the present invention.

What is claimed is:

1. An elastic positioning structure for a semiconductor carrier comprising a plurality of transversely and longitudinally arranged walls which are defined as first walls and second walls which are perpendicular to the first walls, the first walls cooperating with the second walls to define a plurality of recesses, each of the recesses including an opening and a bottom opposite to the opening, a direction in which the first walls extend being defined as a direction X, a direction in which the second walls extend being defined as a direction Y, a depth direction of the recesses being defined as a direction Z, each of the first and second walls including an inner surface located within the recesses and an outer surface outside the recesses, the elastic positioning structure being formed on the inner surfaces of the first and second walls and located within the recesses; the elastic positioning structure in the respective recesses comprising:
at least two stop blocks which are arranged in pairs on the inner surface of one of the walls to divide the inner surface into three sections, each of the stop blocks including a connecting section which is connected to a corresponding one of the walls, and an abutting section which is connected to the connecting section by a bent section and extends along the direction X or Y, a first angle θ1 being defined between the connecting section of each of the stop blocks and the corresponding one of the walls, a second angle θ2 being defined between the connecting section and the abutting section, wherein θ1 and θ2 satisfy the relations: 30°≤θ1≤90° and 90°≤θ2≤160°, a space being between the connecting sections of the two stop blocks, each of the stop blocks including a top surface and a bottom surface, a rear surface being defined between the top surface and the bottom surface of each of the stop blocks and located towards the corresponding one of the walls, and an oblique surface opposite to the rear surface, the oblique surface enabling each of the stop blocks to become a tapered structure tapering from the bottom surface to the top surface, and the bottom surface has a width bigger than a width of the top surface, a deviation of the respective recesses in the direction Z is such that a cross section area each of the respective recesses gradually reduces from the opening to the bottom of each of the recesses.

2. The elastic positioning structure for the semiconductor carrier as claimed in claim 1, wherein one of the first walls is provided with two said stop blocks, and one of the second walls is provided with two said stop blocks.

3. The elastic positioning structure for the semiconductor carriers claimed in claim 1, wherein the oblique surface of each of the stop blocks is provided at the abutting section with a protrusion, and the protrusion includes an inclined guide surface which is connected to the top surface of each of the stop blocks and inclined toward a corresponding one of the recesses.

4. The elastic positioning structure for the semiconductor carrier as claimed in claim 3, wherein each of the stop blocks is further provided with an inclined connecting surface which is formed between the inclined guide surface of the protrusion and the bottom surface of the stop blocks.

5. The elastic positioning structure for the semiconductor carrier as claimed in claim 1, wherein the first angle is 45 degrees, and the second angle is 135 degrees.

6. The elastic positioning structure for the semiconductor carrier as claimed in claim 1, wherein the abutting sections of the two stop blocks which are arranged in pairs on the inner surface of one of the walls extend in opposite directions.

* * * * *